(12) United States Patent  
Laviolette (10) Patent No.: US 9,048,854 B2  
(45) Date of Patent: Jun. 2, 2015

(54) UNICODE CHARACTER CONVERSION USING ONE OF TWO CONVERSION SERVICES

(71) Applicant: BMC Software, Inc., Houston, TX (US)

(72) Inventor: Michel Laviolette, Austin, TX (US)

(73) Assignee: BMC Software Inc., Houston, TX (US)

( * ) Notice: Subject to any disclaimer, the term of this patent is extended or adjusted under 35 U.S.C. 154(b) by 0 days.

(21) Appl. No.: 13/915,233

(22) Filed: Jun. 11, 2013

(65) Prior Publication Data

US 2014/0266818 A1    Sep. 18, 2014

Related U.S. Application Data

(60) Provisional application No. 61/777,830, filed on Mar. 12, 2013.

(51) Int. Cl.
     *H03M 7/40*      (2006.01)  
     *H03M 7/00*      (2006.01)  
     *G06F 17/21*      (2006.01)  
     *H03M 7/14*      (2006.01)

(52) U.S. Cl.  
CPC ................. *H03M 7/00* (2013.01); *G06F 17/21* (2013.01); *H03M 7/14* (2013.01)

(58) Field of Classification Search  
CPC ......... G01L 13/00; G01L 13/08; G06F 17/30; G06F 17/21; G06F 17/2217; G06F 17/2872  
USPC ............................ 341/50, 51, 106, 87, 88, 67  
See application file for complete search history.

(56) References Cited

U.S. PATENT DOCUMENTS

| | | | |
|---|---|---|---|
| 7,218,252 B2* | 5/2007 | Fauque ........................... | 341/50 |
| 7,593,938 B2* | 9/2009 | Lemar et al. .......................... | 1/1 |
| 8,296,747 B2* | 10/2012 | Ishizaki et al. ................ | 717/151 |
| 8,600,729 B2* | 12/2013 | Yang et al. ........................ | 704/2 |
| 2013/0238339 A1* | 9/2013 | Fleizach et al. ............... | 704/260 |

* cited by examiner

*Primary Examiner* — Peguy Jean Pierre  
(74) *Attorney, Agent, or Firm* — Brake Hughes Bellermann LLP (57) ABSTRACT

Disclosed is a method to convert a Unicode character. The method includes intercepting a service call for a character conversion, determining if a character associated with the service call is a candidate for a first conversion service, if the character is a candidate for the first conversion service, converting the character using the first conversion service, if the character is not a candidate for the first conversion service, converting the character using a second conversion service, and returning the converted character.

18 Claims, 5 Drawing Sheets

UNICODE CHARACTER CONVERSION USING ONE OF TWO CONVERSION SERVICES

This application claims the benefit of U.S. Provisional Patent Application 61/777,830 filed on Mar. 12, 2013 entitled Unicode Character Conversion, the entire contents of which are incorporated herein by reference.

FIELD

Embodiments relate to improving Unicode character conversion performance.

BACKGROUND

A problem with conventional Unicode conversion services (e.g., z/OS Unicode conversion services) is that the conversion services use more processing resources than necessary to convert simple character strings. For example, converting from Extended Binary Coded Decimal Interchange Code (EBCDIC) to Unicode typically utilizes more processing resources than necessary. As a result, users of the character conversion may be charged excess fees for conversion. For example, using more processing resources than necessary could impact the rolling four-hour average millions of instructions per second (MIP) consumption vendors (e.g., IBM) use to charge customers for processor time.

Further, excessive time for returning data may result using more processing resources than necessary to convert simple character strings. For example, a webpage with data stored (e.g., in a database) in one format (e.g., a first language) may need to be displayed in another format (e.g., a second language). Conventional conversion services may convert characters slowly (e.g., use more processing resources than necessary) resulting in a slow (e.g., lag) in displaying the webpage.

There is a need for Unicode conversion services that convert simple character strings without using excessive processing resources.

SUMMARY

One embodiment includes a method to convert a Unicode character. The method includes intercepting a service call for a character conversion, determining if a character associated with the service call is a candidate for a first conversion service, if the character is a candidate for the first conversion service, converting the character using the first conversion service, if the character is not a candidate for the first conversion service, converting the character using a second conversion service, and returning the converted character.

Another embodiment includes a computer readable medium. The computer readable medium including code segments causing a processor to perform steps. The steps include intercepting a service call for a character conversion, determining if a character associated with the service call is a candidate for a first conversion service, if the character is a candidate for the first conversion service, converting the character using the first conversion service, if the character is not a candidate for the first conversion service, converting the character using a second conversion service, and returning the converted character.

Still another embodiment includes a method to convert a Unicode character. The method includes determining a location of a control block configured to anchor conversion service routines, saving at least one address stored in the control block, the at least one address being associated with the conversion service routines, one of the at least one addresses including an address for a routine associated with the second conversion service, and replacing the address for the routine associated with the second conversion service with an intercept address. The method further includes intercepting a service call for a character conversion to the intercept address, determining if a character associated with the service call is a candidate for a first conversion service, if the character is a candidate for the first conversion service, converting the character using the first conversion service, if the character is not a candidate for the first conversion service, converting the character using a second conversion service; and returning the converted character.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the example embodiments and wherein.

It should be noted that these Figures are intended to illustrate the general characteristics of methods and/or structure utilized in certain example embodiments and to supplement the written description provided below. The use of similar or identical reference numbers in the various drawings is intended to indicate the presence of a similar or identical element or feature.

DETAILED DESCRIPTION OF THE EMBODIMENTS

While example embodiments may include various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

According to example embodiments, a more efficient (and simpler) code path is used for common character conversions. For example, a more efficient code path may be used for conversions from US and European EBCDIC to Universal Character Set (UCS) Transformation Format 8-bit (UTF-8) American Standard Code for Information Interchange (ASCII) and vice-versa. Single byte character sets may be supported.

Figure 1:
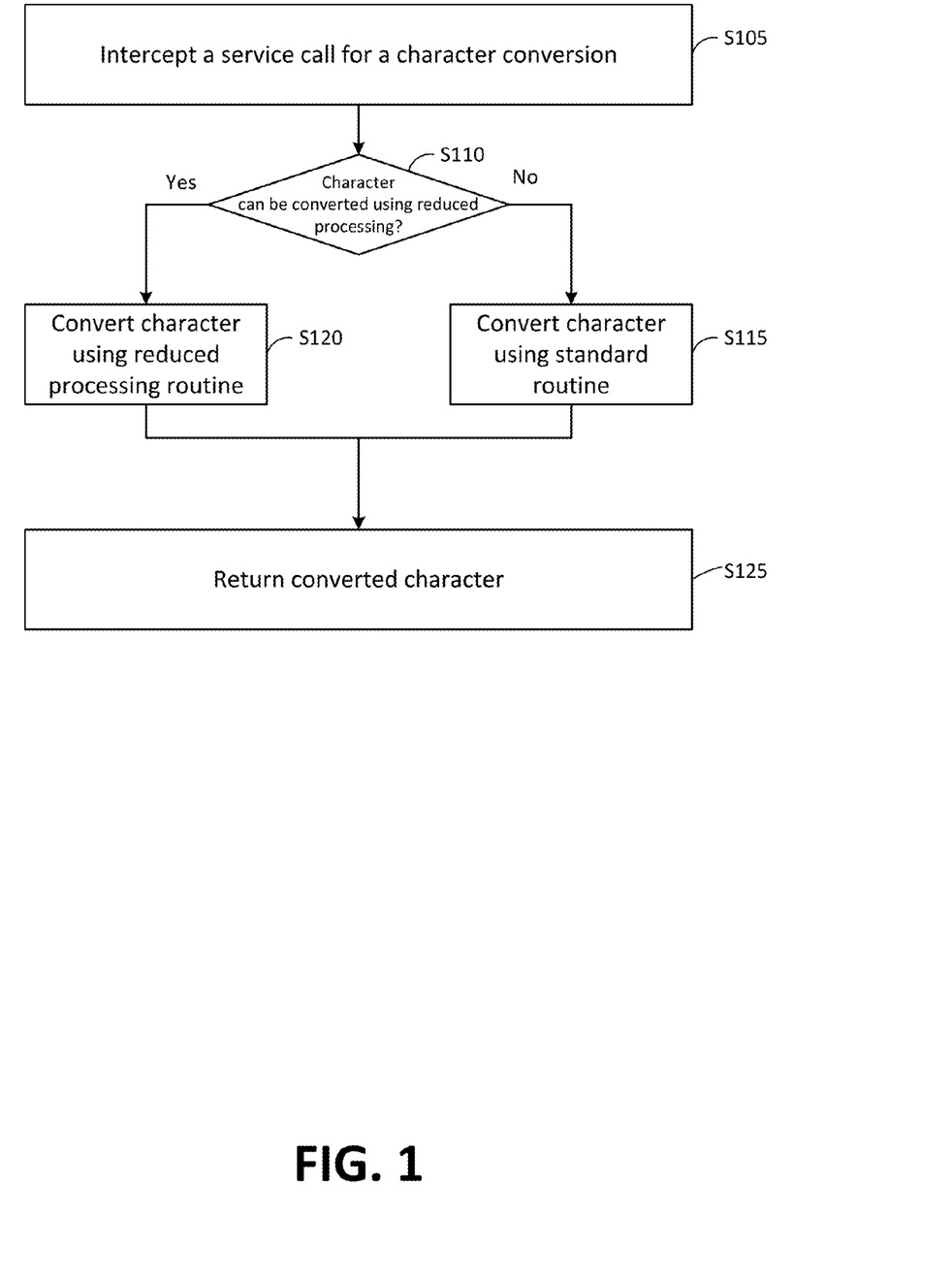
FIG. 1 illustrates a method for converting characters according to at least one example embodiment.
Figure 5:
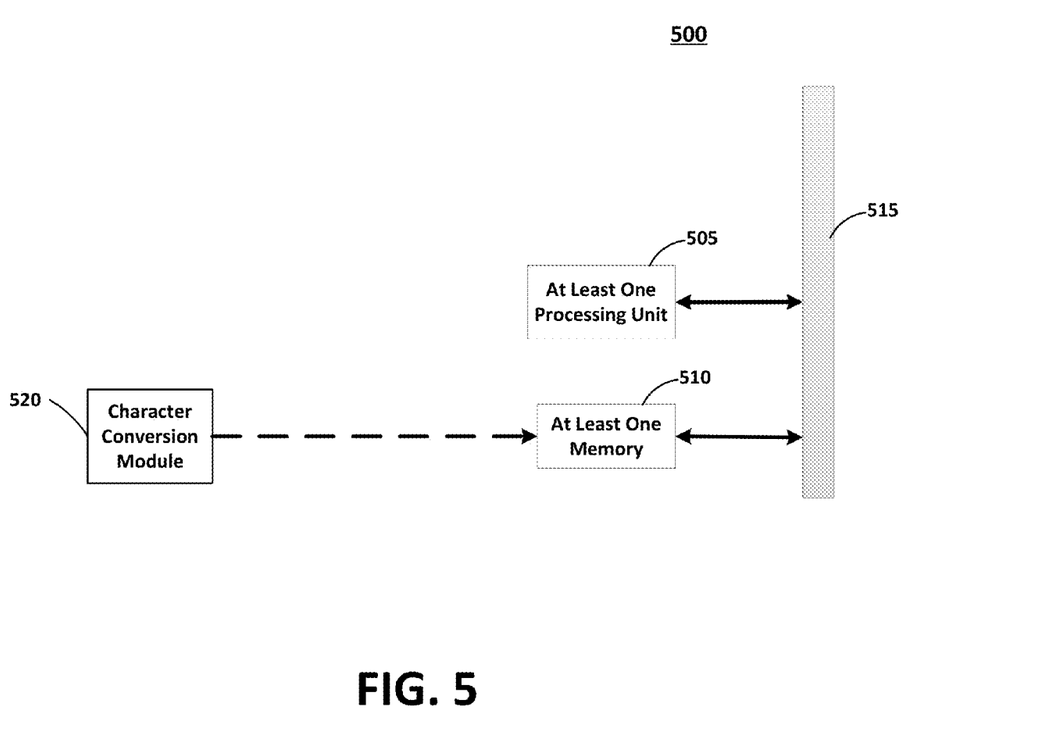
FIG. 5 illustrates a block diagram of an apparatus according to at least one example embodiment.

FIG. 1 illustrates a method for converting characters according to at least one example embodiment. The method steps described with regard to FIG. 1 may be executed as software code stored in a memory (e.g., at least one memory 510 described below) associated with a system (e.g., as shown in FIG. 5) and executed by at least one processor (e.g., at least one processor 505 described below) associated with the system. However, alternative embodiments are contemplated such as a system embodied as a special purpose processor.

For example, the method steps may be performed by an application-specific integrated circuit, or ASIC. For example, the ASIC may be configured as one or more of the blocks, or elements of the blocks, (e.g., the character conversion module 520 described below) and/or the apparatus 500. Although the steps described below are described as being executed by a processor, the steps are not necessarily executed by a same processor. In other words, at least one processor may execute the steps described below with regard to FIG. 1.

As shown in FIG. 1, in step S105 a processor (e.g., at least one processing unit 505) intercepts a service call for a character conversion. For example, a webserver may be processing a request for a webpage. The webserver may call a service to convert a character. For example, data stored in support of the webpage may be in a EBCDIC format. The webpage may be configured to use UTF-8. The service call may include an address of the service, a character to be converted, a "from" format (e.g., EBCDIC), and a "to" format (e.g., UTF-8). The intercept may be associated with the address. For example, the address may be an intercept address (e.g., not a true address for the service call) or service calls to the address may be diverted (e.g., utilizing a trap) to another address.

In step S110 the processor determines if the character can be converted using reduced processing. For example, the character may be looked-up in a table. For example, the table may include simple character strings that are candidates for reduced processing conversion. For example, the table may include a set of 1-byte (8-bit) character conversion pairs. If the character is in the table, the character may be a candidate for conversion using a reduced processing routine. If the character cannot be converted (e.g., is not in the table) using reduced processing, processing continues to step S115. Otherwise, processing continues to step S120.

In step S115 the processor converts the character using a standard routine. For example, the service call may be processed by the routine that the service call was originally intended for (e.g., a z/OS Unicode conversion services routine). For example, if the service call was to an intercept address, the service may be sent to the original address. If the service call was diverted (e.g., by a trap), the service call may be delivered as originally called by, for example the webserver. The standard routine then converts the character using conventional methods.

In step S120 the processor converts the character using a reduced processing routine. For example, the service call may be processed by a new routine that utilizes fewer processing resources than conventional methods. For example, if the service call was to an intercept address, the service may be sent to a new address for the new routine. If the service call was diverted (e.g., by a trap), the service call may be delivered to the new address for the new routine. The new routine then converts the character using methods that uses fewer processing resources than conventional methods.

In step S125 the processor returns the converted character. For example, the converted character, as converted by the standard routine or the new routine, is returned to the webserver that called the service for character conversion.

According to example embodiments, a processor may determine a location of a control block configured to anchor conversion service routines, save at least one address stored in the control block, the at least one address being associated with the conversion service routines, one of the at least one addresses including an address for a routine associated with the second conversion service, and replace the address for the routine associated with the second conversion service with an intercept address.

Figure 2:
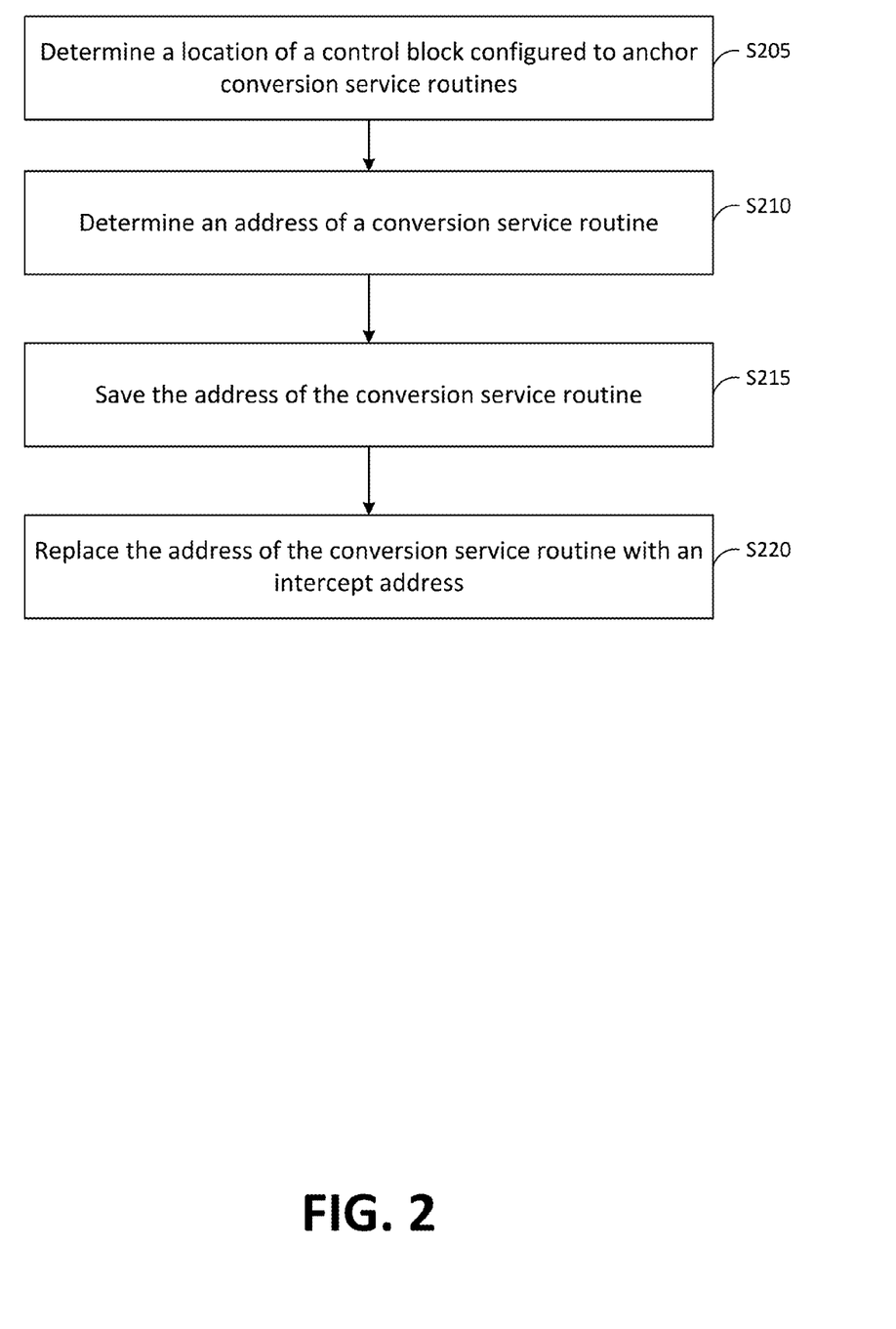
FIG. 2 illustrates a method for intercepting a service call according to at least one example embodiment.

FIG. 2 illustrates a method for intercepting a service call according to at least one example embodiment. The method steps described with regard to FIG. 2 may be executed as software code stored in a memory (e.g., at least one memory 510 described below) associated with a system (e.g., as shown in FIG. 5) and executed by at least one processor (e.g., at least one processor 505 described below) associated with the system. However, alternative embodiments are contemplated such as a system embodied as a special purpose processor.

For example, the method steps may be performed by an application-specific integrated circuit, or ASIC. For example, the ASIC may be configured as one or more of the blocks, or elements of the blocks, (e.g., the character conversion module 520 described below) and/or the apparatus 500. Although the steps described below are described as being executed by a processor, the steps are not necessarily executed by a same processor. In other words, at least one processor may execute the steps described below with regard to FIG. 2.

As shown in FIG. 2, in step S205 a processor (e.g., at least one processing unit 505) determines a location of a control block configured to anchor conversion service routines. For example, the control block may be a Unicode conversion control block (UCCB). There may be two copies of, for example, the UCCB. A first copy (typically a protected copy) may be located in a Common Service Area (CSA). The CSA may contain pageable and fixed data areas that are addressable by active virtual storage address spaces. CSA normally contains data referenced by a number of system address spaces, enabling address spaces to communicate by referencing the same piece of CSA data. Another copy of the UCCB may be located in a commonly addressable data space. For example, the processor may locate an address associated with the UCCB by locating a copy (e.g., the CSA copy) of the UCCB from a Callable Services Router Table. Typically, the Callable Services Router Table can be located by following a pointer beginning from a Communications Vector Table (CVT).

In step S210 the processor determines an address of a conversion service routine. The address may be a pointer (e.g., a relative address) or a handle (e.g., name) for the conversion service (e.g., the standard routine). For example, the processor may look-up an address in the UCCB. The address may be a pointer to the standard conversion routine(s).

In step S215 the processor saves the address of the conversion service routine. For example, the processor may store the address (or pointer or handle) in a memory or database. For example, the processor may read the address (or pointer or handle) in the UCCB and store the address (or pointer or handle) in a memory or database.

In step S220 the processor replaces the address of the conversion service routine with an intercept address. For example, an intercept may be a routine (e.g., software code) configured to determine whether or not a character can be converted using reduced processing (e.g., step S110 described above). The routine may be executable code stored in memory. The executable code may have an associated address (or pointer or handle). The address (or pointer or handle) may replace the address of the standard conversion routine(s). For example, the address (or pointer or handle) of the executable code configured to determine whether or not a character can be converted using reduced processing may replace the address (or pointer or handle) of the standard conversion routine(s) in the UCCB.

Figure 3:
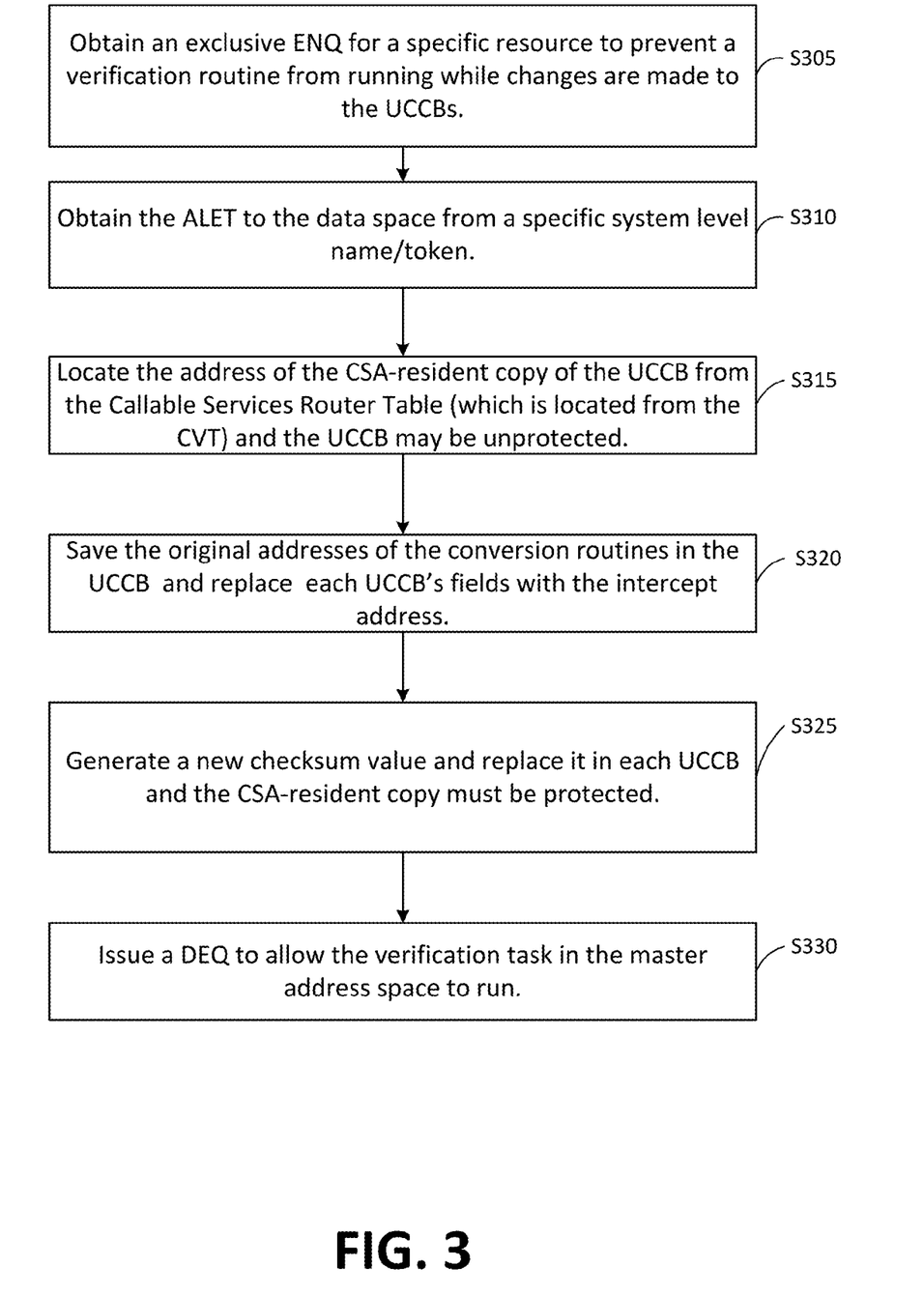
FIG. 3 illustrates another method for intercepting a service call according to at least one example embodiment.

FIG. 3 illustrates another method for intercepting a service call according to at least one example embodiment. The method steps described with regard to FIG. 3 may be executed as software code stored in a memory (e.g., at least one memory 510 described below) associated with a system (e.g., as shown in FIG. 5) and executed by at least one processor (e.g., at least one processor 505 described below) associated with the system. However, alternative embodiments are contemplated such as a system embodied as a special purpose processor.

For example, the method steps may be performed by an application-specific integrated circuit, or ASIC. For example, the ASIC may be configured as one or more of the blocks, or elements of the blocks, (e.g., the character conversion module 520 described below) and/or the apparatus 500. Although the steps described below are described as being executed by a processor, the steps are not necessarily executed by a same processor. In other words, at least one processor may execute the steps described below with regard to FIG. 3.

As shown in FIG. 3, in step S305 a processor (e.g., at least one processing unit 505) obtains an exclusive enqueue (ENQ) for a specific resource to prevent a verification routine from running while changes are made to the UCCB(s). An ENQ may take control of/schedule use of (e.g., restricting others) a resource. An ENQ may include a major name and a minor name. A major name may be associated with a resource and a minor name may be used to identify specific sub-entries within the resource. For example, in z/OS the processor may issue an ENQ with a major name parameter of "SYSZCUN" and a minor name parameter of "IMAGELOCK". Issuing the ENQ may prevent other tasks (e.g., a verification routine) from accessing the UCCB(s).

In step S310 the processor obtains an access list entry token (ALET) to the data space from a specific system level name/token. An ALET is an index to an access list. An access list is a table where each entry represents an address space or data space that programs can access. For example, the ALET may be an index to the data space containing a copy of the UCCB. The ALET may be stored in (e.g., a portion of) the specific system level name/token. For example, in z/OS the specific system level name/token name may be the "SYSZCUN-DATASPACE" and the first four bytes of the token may be the ALET to the data space containing a copy of the UCCB.

In step S315 the processor locates the address of the Common Service Area (CSA) resident copy of the UCCB from the Callable Services Router Table. There may be two copies of, for example, the UCCB. A first copy (typically a protected copy) may be located in the CSA. The CSA may contain pageable and fixed data areas that are addressable by active virtual storage address spaces. CSA normally contains data referenced by a number of system address spaces, enabling address spaces to communicate by referencing the same piece of CSA data. Another copy of the UCCB may be located in a commonly addressable data space. For example, the processor may locate an address associated with the UCCB by locating a copy (e.g., the CSA copy) of the UCCB from a Callable Services Router Table. Typically, the Callable Services Router Table can be located by following a pointer beginning from a Communications Vector Table (CVT).

In step S320 the processor saves the original addresses of the conversion routines in the UCCB and replaces each UCCB's fields with an intercept address. For example, the address may be a pointer (e.g., a relative address) or a handle (e.g., name, token) for the conversion service (e.g., the standard routine). For example, the processor may look-up an address in the UCCB using the ALET and the address of the Common Service Area (CSA) resident copy of the UCCB.

The address may be a pointer to the standard conversion routine(s). The processor saves the address of the conversion service routine. For example, the processor may store the address (or pointer or handle) in a memory or database. For example, the processor may read the address (or pointer or handle) in the UCCB and store the address (or pointer or handle) in a memory or database.

The processor replaces the address of the conversion service routine with an intercept address. For example, an intercept may be a routine (e.g., software code) configured to determine whether or not a character can be converted using reduced processing (e.g., step S110 described above). The routine may be executable code stored in memory. The executable code may have an associated address (or pointer or handle). The address (or pointer or handle) may replace the address of the standard conversion routine(s). For example, the address (or pointer or handle) of the executable code configured to determine whether or not a character can be converted using reduced processing may replace the address (or pointer or handle) of the standard conversion routine(s) in the UCCB.

In step S325 the processor generates a new checksum value and replaces the checksum value in each UCCB. The CSA-resident copy is then protected (e.g., read-only). Checksum is an error-checking technique to verify the integrity of data contained in a file or area of memory. For example, a checksum value is generated by adding the value in each field of the (revised) UCCB(s) with the exception of the checksum field itself. The resultant sum is then set as the checksum value.

In step S330 the processor issues a DEQ to allow the verification task in the master address space to run. A DEQ releases control of a resource previously controlled using an ENQ. As in the ENQ, a DEQ may include a major name and a minor name. A major name may be associated with a resource and a minor name may be associated with a specific sub-entry within the resource. For example, in z/OS the processor may issue a DEQ with a major name parameter of "SYSZCUN" and a minor name parameter of "IMAGELOCK". Issuing the DEQ may allow previously restricted other tasks (e.g., a verification routine) to access the UCCB(s).

Figure 4:
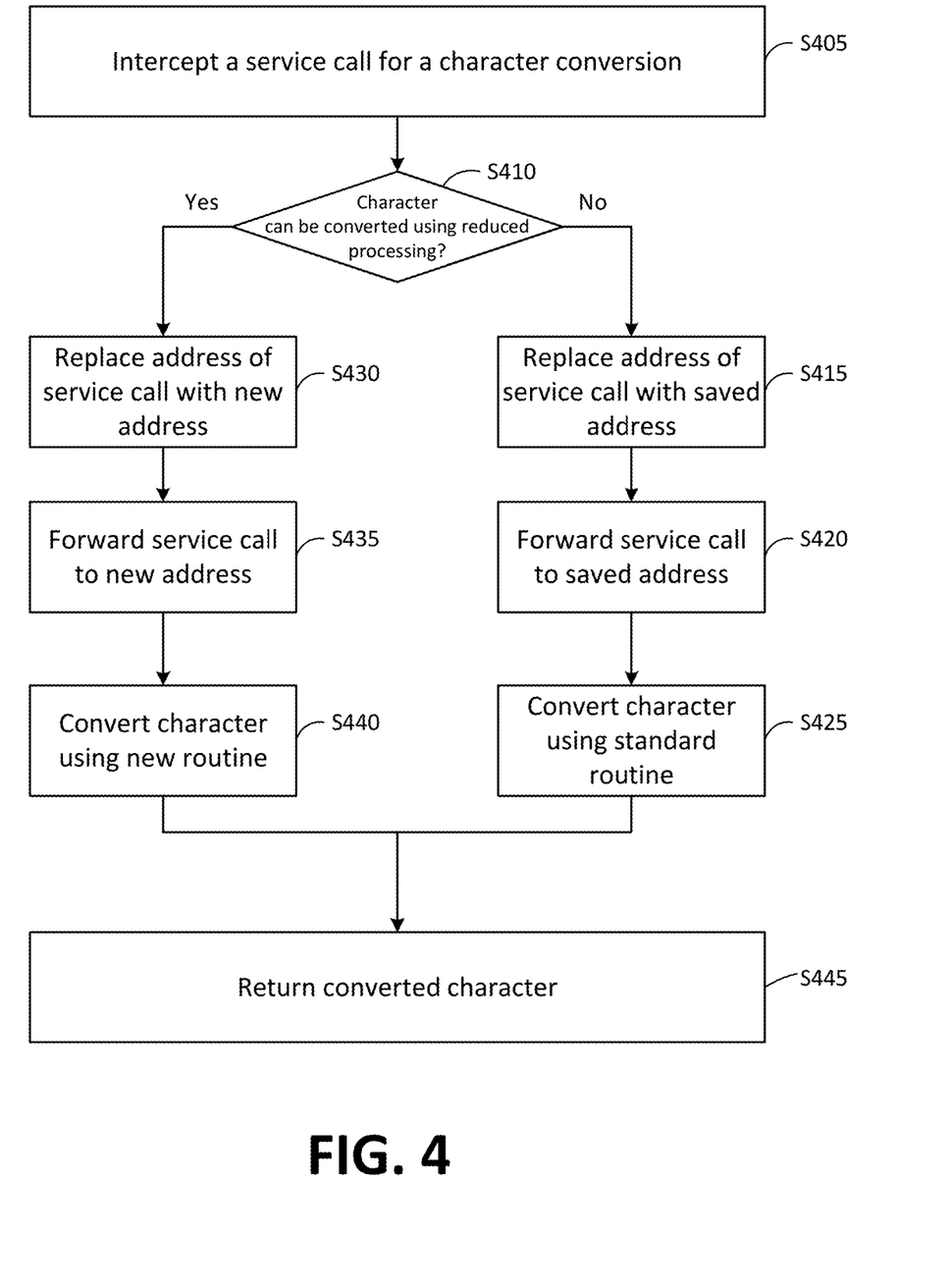
FIG. 4 illustrates another method for converting characters according to at least one example embodiment.

FIG. 4 illustrates another method for converting characters according to at least one example embodiment. The method steps described with regard to FIG. 4 may be executed as software code stored in a memory (e.g., at least one memory 510 described below) associated with a system (e.g., as shown in FIG. 5) and executed by at least one processor (e.g., at least one processor 505 described below) associated with the system. However, alternative embodiments are contemplated such as a system embodied as a special purpose processor.

For example, the method steps may be performed by an application-specific integrated circuit, or ASIC. For example, the ASIC may be configured as one or more of the blocks, or elements of the blocks, (e.g., the character conversion module 520 described below) and/or the apparatus 500. Although the steps described below are described as being executed by a processor, the steps are not necessarily executed by a same processor. In other words, at least one processor may execute the steps described below with regard to FIG. 4.

As shown in FIG. 4, in step S405 a processor (e.g., at least one processing unit 505) intercepts a service call for a character conversion. For example, a webserver may be processing a request for a webpage. The webserver may call a service to convert a character. For example, data stored in support of the webpage may be in EBCDIC format. The webpage may be configured to use UTF-8. The service call may include an address of the service, a character to be converted, a "from"

format/type (e.g., EBCDIC), and a "to" format/type (e.g., UTF-8). The intercept may be associated with the address. For example, the address of the service call may be an intercept address (e.g., not a true address for the service call) or service calls to the address may be diverted (e.g., utilizing a trap) to another address.

In step S410 determines if the character can be converted using reduced processing. For example, the character may be looked-up in a table. For example, the table may include simple character strings that are candidates for reduced processing conversion. For example, the table may include a set of 1-byte (8-bit) character conversion pairs. If the character is in the table, the character may be a candidate for conversion using a reduced processing routine. If the character cannot be converted using reduced processing, processing continues to step S415. Otherwise, processing continues to step S430.

According to example embodiments, conversions where a single byte can be translated to a single byte may eligible for conversion using reduced processing. For example, the processor may determine if the character is in a single byte character format, determine if a character conversion type is a single byte character format, and if both the character is in a single byte character format and the character conversion type is a single byte character format, the character is a candidate for character conversion using reduced processing.

A translate and test (TRT) instruction may be used with the TRT table generated for a given character set pair to determine if a conversion request is eligible for conversion using reduced processing. If so, a translate (TR) instruction may be used with the associated TR table to perform the conversion. Both tables (TRT and TR) are dynamically generated by calling the z/OS 31-bit Unicode character conversion service for each byte from x'00' to x'FF' for a given character set pair. The return code from each call to the service is used to build the TRT table, and if the return code indicates a successful translation the TR table is updated with the converted value. These tables may be built for specific pairs of character sets (e.g., From/to US EBCDIC and UTF-8; From/to European EBCDIC and UTF-8).

Further, other conditions may make a conversion request ineligible. For example, requests having a zero buffer length (e.g., a valid request, but nothing to translate), requests where the input and output buffers overlap, and requests having character set pairs that are not supported by the intercept (e.g., from US EBCDIC to Japanese double-byte characters). Therefore, the processor may determine a character length of the character, and if the character length equals zero, the character is not a candidate for character conversion using reduced processing. The processor may read a character type pair from the service call, the character type pair may include a character type of the character and a character type of the converted character. The processor may determine if the character type pair is in a look-up table of supported character type pairs, and if the character type pair is in the look-up table, the character is a candidate for character conversion using reduced processing.

In step S415 the processor replaces the address of the service call with a saved address. As discussed above, the address for a standard character conversion routine may be read from a UCCB and stored in memory. As a result, if the character cannot be converted using reduced processing, the address for the standard character conversion routine may be read from memory, and for example, replaced the intercept address in the service call.

In step S420 the processor forwards the service call to the saved address. For example, the processor may redirect the service call to the standard character conversion routine. The processor may use the service call but with the address read from memory (e.g., the address of the standard character conversion routine).

In step S425 the processor converts the character using a standard routine. For example, the service call may be processed by the routine that the service call was originally intended for (e.g., a z/OS Unicode conversion services routine). For example, if the service call was to an intercept address, the service may be sent to the original address. If the service call was diverted (e.g., by a trap), the service call may be delivered as originally called by, for example the webserver. The standard routine then converts the character using conventional methods.

In step S430 the processor replaces the address of the service call with a new address. For example, the service call may be processed by a new routine that utilizes fewer processing resources than conventional methods. The new routine may be executable code stored in memory. The executable code may have an associated address (or pointer or handle). The address (or pointer or handle) may replace the intercept address. For example, the address (or pointer or handle) of the executable code routine that utilizes fewer processing resources than conventional methods may replace the intercept address.

In step S435 the processor forwards the service call to the new address. For example, the processor may redirect the service call to the new character conversion routine. The processor may use the service call but with the address of the executable code routine that utilizes fewer processing resources than conventional methods.

In step S440 the processor converts the character using a new routine. The new routine, when executed by the processor, may use fewer processing resources than the standard routine, when executed by the processor. According to example embodiments, the processor may generate a first table and a second table based on plurality of single byte service calls to a four byte conversion routine. Each of the service calls may include a character set pair, the character set pair may include a first character type and a second character type for a same character. Utilizing the first table the processor may determine if a conversion is supported based on the character set pair and add a converted value for the character set pair to the second table if the conversion is supported. The first conversion service may include a first routine for converting characters, and the first routine may use the second table to determine a conversion value for the character. Each of the converted character set pairs may be assigned a handle.

As discussed above, the translate and test (TRT) instruction may be used with the TRT table generated for a given character set pair to determine if a conversion request is eligible for conversion using reduced processing. If so, a translate (TR) instruction may be used with the associated TR table to perform the conversion.

In step S445 the processor returns the converted character. For example, the converted character, as converted by the standard routine or the new routine, is returned to the webserver that called the service for character conversion.

FIG. 5 illustrates a block diagram of an apparatus according to at least one example embodiment. As shown in FIG. 5, the apparatus 500 includes at least one processing unit 505, at least one memory 510, and a character conversion module 520. The at least one processing unit 505 and the at least one memory 510 are communicatively coupled via bus 515. The apparatus 500 may be, for example, an element of a server or other computing device.

In the example of FIG. 5, the apparatus 500 may be at least one computing device and should be understood to represent virtually any computing device configured to perform the methods described herein. As such, the apparatus 500 may be understood to include various standard components which may be utilized to implement the techniques described herein, or different or future versions thereof. By way of example, the apparatus 500 is illustrated as including the at least one processing unit 505, as well as at least one memory 510 (e.g., a computer readable storage medium).

Thus, as may be appreciated, the at least one processing unit 505 may be utilized to execute instructions stored on the at least one memory 510, so as to thereby implement the various features and functions described herein, or additional or alternative features and functions. Of course, the at least one processing unit 505 and the at least one memory 510 may be utilized for various other purposes. In particular, it may be appreciated that the at least one memory 510 may be understood to represent an example of various types of memory and related hardware and software which might be used to implement any one of the modules described herein. Systems and/or methods described below may include data and/or storage elements. The data and/or storage elements (e.g., data base tables) may be stored in, for example, the at least one memory 510.

The character conversion module 520 may be stored on the at least one memory 510. For example, the character conversion module 520 may be a plugin software stored on the at least one memory 510. The character conversion module 520 may store data and/or code that when executed by the at least one processing unit 505 performs the functions associated with the character conversion module 520. Alternatively, or in addition to, the character conversion module 520 may be an application-specific integrated circuit, or ASIC. For example, the ASIC may be configured as one or more of the module, or elements of the modules, of the character conversion module 520. The character conversion module 520 may be a standalone hardware module including a processor (not shown) configured to perform the associated functions.

The character conversion module 520 may be configured to convert a character from one format to another utilizing a standard routine or a reduced processing routine. Additional aspects of the character conversion module 520 are described in more detail in the method described herein.

In addition, the method may use two instructions included in IBM's mainframe architecture. The two instructions are the translate and test (TRT) and translate (TR) instructions. The addresses of the z/OS Unicode conversion services routines are anchored in a control block in common storage called the UCCB. In example embodiments, these addresses are replaced with others pointing to intercept routines that examine the conversion services call and input data and will use the TR instruction where possible to perform the conversion. If the intercept determines that this is not possible, control is passed to the z/OS routine to perform the conversion.

The method of planting the intercept is further described as follows. There are two copies of the UCCB—one is located in CSA, the other in a commonly addressable data space. A task runs in the master address space every 15 minutes to compare the two copies, taking an SVC dump and issuing a console message if discrepancies are discovered. This task may also verify the checksum value generated by logically adding each field in the UCCB with the exception of the checksum field itself.

First, an exclusive ENQ for a specific resource may be obtained to prevent this verification routine from running while changes are made to the UCCBs. Next, the ALET to the data space may be obtained from a specific system level name/token. The address of the CSA-resident copy of the UCCB may then be located from the Callable Services Router Table (which is located from the CVT) and the UCCB may be unprotected. The original addresses of the conversion routines in the UCCB may be saved off and each UCCB's fields replaced with the intercept address. The address of the data space-resident copy of the UCCB is hexadecimal 1000. A new checksum value may be generated and replaced in each UCCB and the CSA-resident copy must be protected. Finally, a DEQ may be issued to allow the verification task in the master address space to run.

Determining eligibility for character conversion using reduced processing includes allowing conversions where a single byte can be translated to a single byte. A TRT instruction may be used with a TRT table generated for a given character set pair to determine if a request is eligible. If so, a TR instruction is used with an associated TR table to perform the conversion. Both tables (TRT and TR) are dynamically generated by calling the z/OS 31-bit Unicode character conversion service for each byte from x'00' to x'FF' for a given character set pair. The return code from each call to the service is used to build the TRT table, and if the return code indicates a successful translation the TR table is updated with the converted value. These tables may be built for specific pairs of character sets (e.g, From/to US EBCDIC and UTF-8; From/to European EBCDIC and UTF-8).

In other words, before converting a character from one type to another, it must be determined if the conversion can be done and, if so, the correct converted value must be known. Conventionally, the converted value is hard-coded in a table that is part of the conventional conversion program. This is the method used by the standard routine. In order to provide the same result as the standard service, example embodiments do not hard-code a conversion table in the conversion routine using reduced processing. By contrast, example embodiments may call the conventional service for every single-byte character (hex 00 through FF) and build a table dynamically before replacing the addresses of the service routines in the UCCB control block. As a result, two tables are created, the first table indicating if the conversion is possible and the second table containing the converted value. A pair of such tables is generated for each supported character type pair and is done before intercepting the standard service calls.

There may be two conventional service routines that are called to generate the tables. Both routines perform the same function, but one is for 31-bit callers while the second is for 64-bit callers. The two service routines return the same conversion results but different handles. Once the intercepts have been set, the conversion service according to example embodiments may interrogate the first table for a given character set pair to determine if conversion is possible, then use the second table to perform the conversion.

By generating the tables dynamically using the z/OS service itself, maintenance of the tables and human error is eliminated. This generation may be done prior to planting the intercept address.

The z/OS service also accepts a handle as input. The handle produced by the call to the z/OS service is saved off for use by the intercept. The handle generated by the 64-bit service is slightly different, so the 64-bit service is called once for a character set pair to get the appropriate handle. Other conditions making a request ineligible include: Requests having a zero buffer length (a valid request, but nothing to translate);

Requests where the input and output buffers overlap; Requests having character set pairs that are not supported by the intercept.

Some of the above example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example embodiments are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. A method to convert a character, the method comprising:
intercepting a service call for a character conversion;
determining if the character is in a single byte character format;
determining if a character conversion type is a single byte character format; and
upon determining the character is in a single byte character format and the character conversion type is a single byte character format, the character is a candidate for a first conversion service;
upon determining the character is a candidate for the first conversion service, converting the character using the first conversion service;
upon determining the character is not a candidate for the first conversion service, converting the character using a second conversion service; and
returning the converted character.

2. The method of claim 1, wherein
the service call is to an address for the first conversion service, and
the service call is redirected to an address for the second conversion service if the character is not a candidate for the first conversion service.

3. The method of claim 1, wherein the service call includes the character, a character type associated with the character, and a character type to convert the character to.

4. The method of claim 1, wherein determining if the character is a candidate for a first conversion service includes:
determining the character length of the character, and
if the character length equals zero, the character is not a candidate for a first conversion service.

5. The method of claim 1, wherein determining if the character is a candidate for a first conversion service includes:
reading the character type pair from the service call, the character type pair including a character type of the character and a character type of the converted character;
determining if the character type pair is in a look-up table of supported character type pairs; and
if the character type pair is in the look-up table, the character is a candidate for a first conversion service.

6. The method of claim 1, further comprising:
determining a location of a control block configured to anchor conversion service routines;
saving at least one address stored in the control block, the at least one address being associated with the conversion service routines, one of the at least one addresses including an address for a routine associated with the second conversion service; and
replacing the address for the routine associated with the second conversion service with an intercept address.

7. The method of claim 1, wherein
the first conversion service includes a first routine for converting characters;
the second conversion service includes a second routine for converting characters; and
the first routine, when executed by a processor, uses fewer processing resources than the second routine, when executed by the processor.

8. The method of claim 1, further comprising:
generating a first table and a second table based on plurality of single byte service calls to a four byte conversion routine, each of the service calls including a character set pair, the character set pair including a first character type and a second character type for a same character;
utilizing the first table to determine if a conversion is supported based on the character set pair;
adding a converted value for the character set pair to the second table if the conversion is supported;
the first conversion service includes a first routine for converting characters; and
the first routine uses the second table to determine a conversion value for the character.

9. The method of claim 8, wherein each of the converted character set pairs is assigned a handle.

10. A non-transitory computer readable medium including code segments that when executed by a processor cause the processor to:
intercept a service call for a character conversion;
determine if the character is in a single byte character format;
determine if a character conversion type is a single byte character format; and
upon determining the character is in a single byte character format and the character conversion type is a single byte character format, the character is a candidate for a first conversion service;
upon determining the character is a candidate for the first conversion service, convert the character using the first conversion service;
upon determining the character is not a candidate for the first conversion service, convert the character using a second conversion service; and
return the converted character.

11. The non-transitory computer readable medium of claim 10, wherein
the service call is to an intercept address, and
the service call is redirected to an address for the second conversion service if the character is not a candidate for the first conversion service.

12. The non-transitory computer readable medium of claim 10, wherein the service call includes the character, a character type associated with the character, and a character type to convert the character to.

13. The non-transitory computer readable medium of claim 10, wherein determining if the character is a candidate for a first conversion service includes:
determining the character length of the character, and
if the character length equals zero, the character is not a candidate for a first conversion service.

14. The non-transitory computer readable medium of claim 10, wherein determining if the character is a candidate for a first conversion service includes:
reading the character type pair from the service call, the character type pair including a character type of the character and a character type of the converted character;
determining if the character type pair is in a look-up table of supported character type pairs; and
if the character type pair is in the look-up table, the character is a candidate for a first conversion service.

15. The non-transitory computer readable medium of claim 10, wherein the code segments further cause the processor to:
determine a location of a control block configured to anchor conversion service routines;
save at least one address stored in the control block, the at least one address being associated with the conversion service routines, one of the at least one addresses including an address for a routine associated with the second conversion service; and replace the address for the routine associated with the second conversion service with an intercept address.

16. The non-transitory computer readable medium of claim 10, wherein
the first conversion service includes a first routine for converting characters;
the second conversion service includes a second routine for converting characters; and
the first routine, when executed by a processor, uses fewer processing resources than the second routine, when executed by the processor.

17. The non-transitory computer readable medium of claim 10, wherein the code segments further cause the processor to:
generate a first table and a second table based on plurality of single byte service calls to a four byte conversion routine, each of the service calls including a character set pair, the character set pair including a first character type and a second character type for a same character;
utilize the first table to determine if a conversion is supported based on the character set pair;
add a converted value for the character set pair to the second table if the conversion is supported;
the first conversion service includes a first routine for converting characters; and
the first routine uses the second table to determine a conversion value for the character.

18. A method to convert a character, the method comprising:
determining a location of a control block configured to anchor conversion service routines;
saving at least one address stored in the control block, the at least one address being associated with the conversion service routines, one of the at least one addresses including an address for a routine associated with the second conversion service;
replacing the address for the routine associated with the second conversion service with an intercept address;
intercepting a service call for a character conversion to the intercept address;
determining if a character associated with the service call is a candidate for a first conversion service;
if the character is a candidate for the first conversion service, converting the character using the first conversion service;
if the character is not a candidate for the first conversion service, converting the character using a second conversion service; and
returning the converted character.

* * * * *